(12) United States Patent
Jeon et al.

(10) Patent No.: US 6,247,153 B1
(45) Date of Patent: Jun. 12, 2001

(54) METHOD AND APPARATUS FOR TESTING SEMICONDUCTOR MEMORY DEVICE HAVING A PLURALITY OF MEMORY BANKS

(75) Inventors: Soon-keun Jeon, Seoul; Sang-soo Kang, Kyungki-do, both of (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/295,179

(22) Filed: Apr. 20, 1999

(30) Foreign Application Priority Data

Apr. 21, 1998 (KR) .................................................. 98-14241

(51) Int. Cl.⁷ ............................. G11C 29/00; G11C 7/00
(52) U.S. Cl. ........................ 714/718; 714/719; 365/200; 365/201; 365/230.03
(58) Field of Search ................................. 714/718, 719, 714/721, 723; 365/200, 201, 225.7, 230.03, 233, 230.01; 702/117

(56) References Cited

U.S. PATENT DOCUMENTS 5,383,193 * 1/1995 Patjak et al. ........................ 714/721
5,689,465 * 11/1997 Nasu et al. ............................ 365/200
5,991,232 * 11/1999 Matsumura et al. .................. 365/233

FOREIGN PATENT DOCUMENTS

| 61-113184 | 5/1986 | (JP) . |
| 3209699 | 9/1991 | (JP) . |
| 9245498 | 9/1997 | (JP) . |

OTHER PUBLICATIONS

Notice to Submit Response, Korean Application No. 10-1998-0014241, Sep. 28, 2000.

* cited by examiner

*Primary Examiner*—Emmanuel L. Moise
(74) *Attorney, Agent, or Firm*—Myers Bigel Sibley & Sajovec

(57) ABSTRACT

A method and apparatus for testing a semiconductor memory device having a plurality of memory banks are provided. Virtual addresses for differentiating the respective memory cell arrays are generated in the semiconductor memory device. The data stored in the memory cells of physical addresses is sequentially read according to the virtual addresses. Thus, it is possible to know the memory cell array to which a defective memory cell belongs.

15 Claims, 10 Drawing Sheets

METHOD AND APPARATUS FOR TESTING SEMICONDUCTOR MEMORY DEVICE HAVING A PLURALITY OF MEMORY BANKS

BACKGROUND OF THE INVENTION

1. Field of the Invention

The present invention relates to a semiconductor memory device, and more particularly, to a method and apparatus for testing a semiconductor memory device having a plurality of memory banks, by which the physical address of a defective memory cell can be found easily.

2. Description of the Related Art

Recently, a combined semiconductor memory device, i.e., a memory merged with a logic circuit (MML), has developed rapidly.

In highly integrated memories, redundant line analysis is performed, by which a high yield can be expected.

Here, since data input/output pins in a memory included in the MML are formed in plural formats, for example, x64 , x128, x256, x512, x1024, and so on, the memory operates fast. At this time, due to the limit in the number of input/output pins of a memory testing apparatus, the multiple input/output memory cannot be tested. Also, due to the limit in generation of patterns by an algorithmic pattern generator, a logic circuit testing apparatus cannot test a highly integrated memory.

Thus, currently, the memory is directly accessed in a mode register setting method so that a plurality of data input/output lines are allocated to representative data output pins to test the memory in x4, x8, x16, and so on.

For example, a 16-MB DRAM having 64 data input/output lines multiplexes the data input/output lines at a ratio of 8 to 1 in the mode register setting method during a direct access test mode, so that data is input from and output to 8 data pins.

A conventional DRAM testing apparatus comprises an error catching portion, a pattern generator, a comparator, and a data detector. The memory cells are tested by writing data to the memory cells according to an address pattern and data pattern generated by the pattern generator, and reading the data.

Thus, in a semiconductor memory device having a plurality of memory banks such as MML or synchronous DRAM, the separate memory banks are not differentiated. Thus, in the case of testing the memory cells using the DRAM testing apparatus, it is not possible to find which memory bank includes a defective memory cell. Also, since data is output to only a representative data pin among various data pins, by the MRS mode setting method, it is not possible to know through which data input/output line the data is output.

FIG. 1 shows the memory structure of a semiconductor memory device having a plurality of memory banks.

Referring to FIG. 1, the semiconductor memory device includes memory banks Bank1 and Bank2 each having 8 memory blocks Blocks 0 through 7 and Blocks 8 through 15.

The memory blocks Blocks 0 through 15 each include two memory cell arrays. Each of the memory cell arrays includes memory cells allocated to 9-bit row addresses X0 through X255 or X256 or X511, 8-bit column addresses Y0 through Y255, and physical addresses composed of the row and column addresses, two row redundancy lines RR and four column redundancy lines for repairing a defective memory cell if any.

FIG. 2 is a schematic diagram illustrating how the semiconductor memory device shown in FIG. 1 is tested.

Referring to FIG. 2, a conventional memory testing apparatus 12 includes an error catching portion 22, e.g., an error catch RAM. The error catching portion 22 stores test results for the memory blocks of a semiconductor memory device 11.

In more detail, the error catching portion 22 is divided into four addresses, and each address stores either the physical address of a defective memory cell of a memory portion 21 or the number of a data pin through which the data is output from the memory cell for the physical address, i.e., one of data pins DQ0 through DQ3.

For example, the physical addresses of defective memory cells of the memory blocks Block0, Block2, Block8 and Block10 in which the eighth bit of the row address bit 8, i.e., RA8, is logic low ("0") and the data is output through a data in DQ0 or DQ3, and the numbers of the data pins, are stored in the first address of the error catching portion 22. Also, the physical addresses of defective memory cells of the memory blocks Block 5, Block7, Block13 and Block15 in which the eighth bit of the row address, i.e., RA8, is logic high ("1") and the data is output through a data pin DQ1 or DQ2, and the numbers of the data pins, are stored in the fourth address of the error catching portion 22.

The physical address of any failing memory cell is replaced by a row redundant line or column redundant line, according to the information stored in the error catching portion 22.

However, since the information for four memory blocks is repeatedly stored, it is not possible to know which one of the memory blocks contains the defective cell.

For example, if data failure information appears in the first address of the error catching portion 22, it is not possible to know which memory block among the memory blocks 0, 2, 8 and 10 includes the defective memory cell. Also, when the memory cells of different physical addresses are tested in the memory blocks 0, 2, 8 and 10, since the different physical addresses overlap one another in the error catching portion 22, the physical address at which data failure actually occurs cannot be found. Thus, it is difficult to analyze bit failure.

SUMMARY OF THE INVENTION

To solve the above problems, it is an objective of the present invention to provide a method for testing a semiconductor memory device having a plurality of memory blocks and memory banks, which can find the memory block of a memory bank to which a defective memory cell belongs.

It is another objective of the present invention to provide an apparatus for testing a semiconductor memory device, which can find the memory block of a memory bank to which a defective memory cell belongs.

Accordingly, to achieve the first objective, there is provided a memory testing method of a semiconductor memory device having a plurality of memory banks, each memory bank having a plurality of memory blocks, each memory block having a plurality of memory cell arrays, each memory cell array having a plurality of memory cells, each memory cell allocated to physical addresses composed of row addresses and column addresses, the method comprising the steps of: (1) selecting one of the memory banks and writing data to all the memory cells formed in the selected memory bank which are allocated to first addresses which are physical; (2) sequentially selecting the memory banks one by one and performing the step (1); (3) generating virtual second addresses, for differentiating the memory cells of the first addresses; and (4) sequentially reading out data from the memory cells of the first addresses while changing the bits of the first and second addresses, to the outside of the semiconductor memory device through data pins, and determining a memory cell array to which a defective memory cell belongs, using the first and second addresses and the numbers of the data pins through which the data are output, if the read data is not the same as the data written in the step (1) or (2).

To achieve the second objective, there is provided an apparatus for testing a semiconductor memory device having a plurality of memory banks, each memory bank having a plurality of memory blocks, each memory block having a plurality of memory cell arrays, each memory cell array having a plurality of memory cells, each memory cell allocated to physical addresses composed of row addresses and column addresses, the apparatus comprising: a pattern generator for generating a pattern composed of first addresses which are physical addresses, having row addresses and column addresses, to which the memory cells are allocated, and first data for being written to the memory cells allocated to the first addresses; a virtual address generator for generating second addresses which are virtual addresses, for differentiating the memory cells of the first addresses; a data detector for detecting second data output through data input/output pins of the semiconductor memory device; a comparator for comparing the second data detected by the data detector with the first data, and outputting the numbers of the data input/output pins as third data; and an error catching portion for storing the first addresses, the second addresses and the third data, wherein the first addresses, the second addresses and the third data are analyzed to determine which memory cells are defective, and to which memory bank, memory block and memory cell array each defective memory cell belongs.

Therefore, according to the present invention, the memory cell array including a defective memory cell can be found in a semiconductor memory device having a plurality of memory banks.

BRIEF DESCRIPTION OF THE DRAWINGS

The above objectives and advantages of the present invention will become more apparent by describing in detail a preferred embodiment thereof with reference to the attached drawings in which.

DESCRIPTION OF THE PREFERRED EMBODIMENTS

The present invention will now be described in detail with reference to the accompanying drawings.

Figure 1:
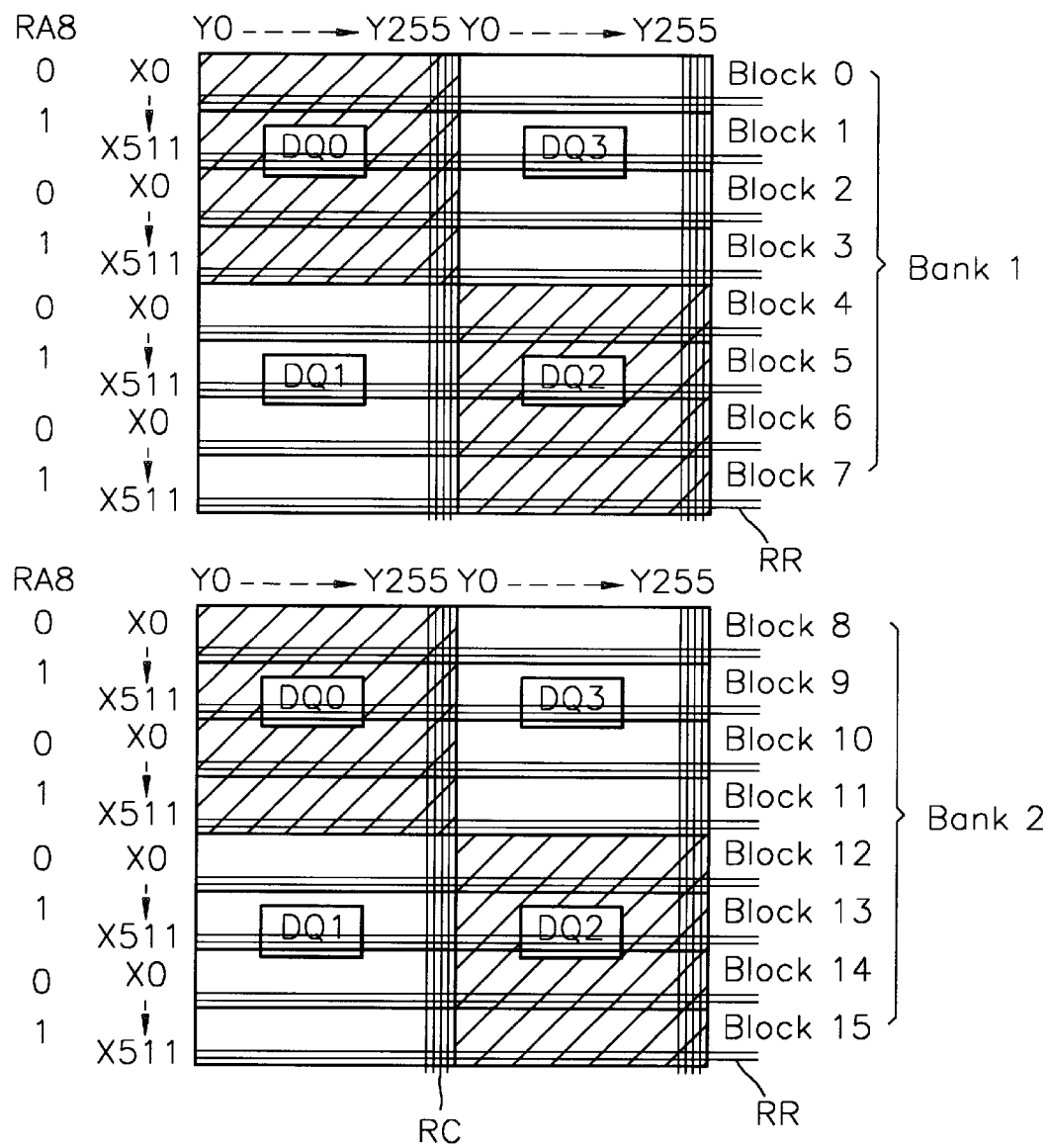
FIG. 1 is a schematic diagram illustrating the conventional memory structure of a semiconductor memory device having a plurality of memory banks.
Figure 2:
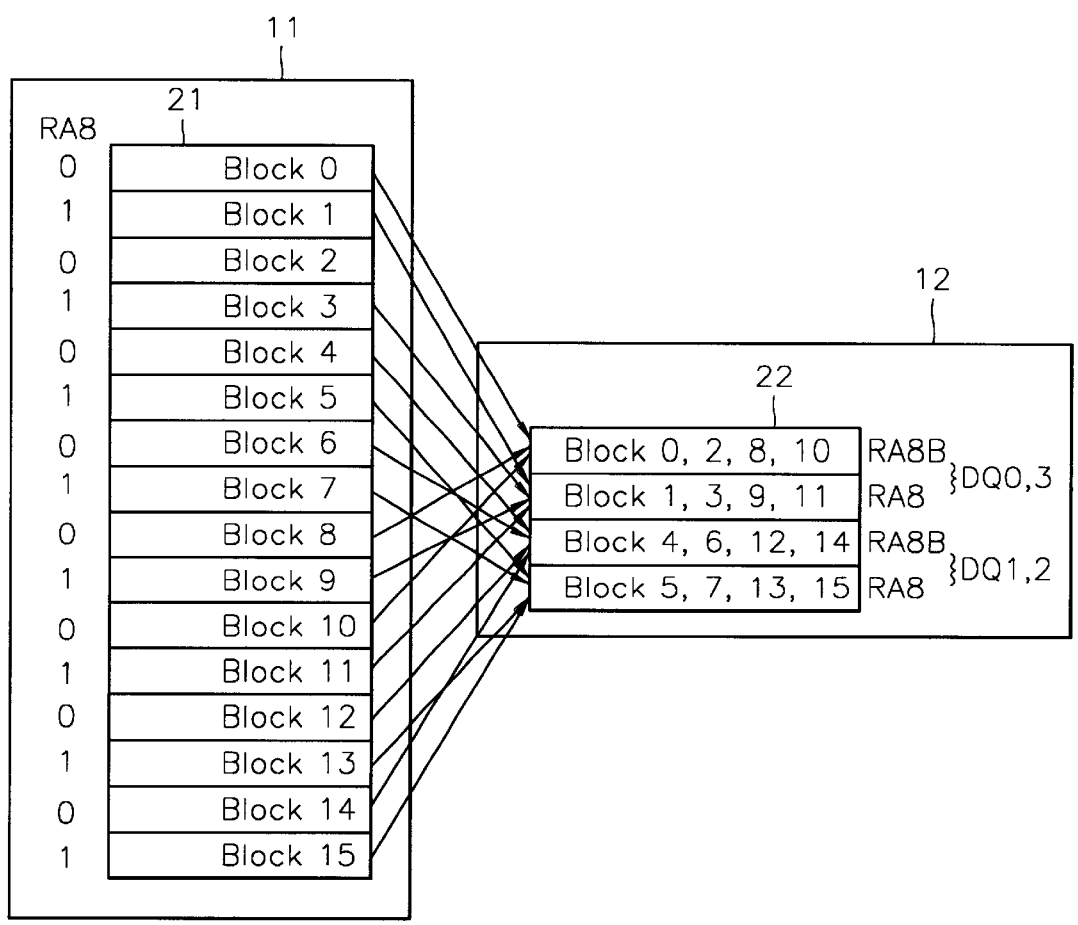
FIG. 2 is a schematic diagram illustrating how the semiconductor memory device shown in FIG. 1 is tested.
Figure 3:
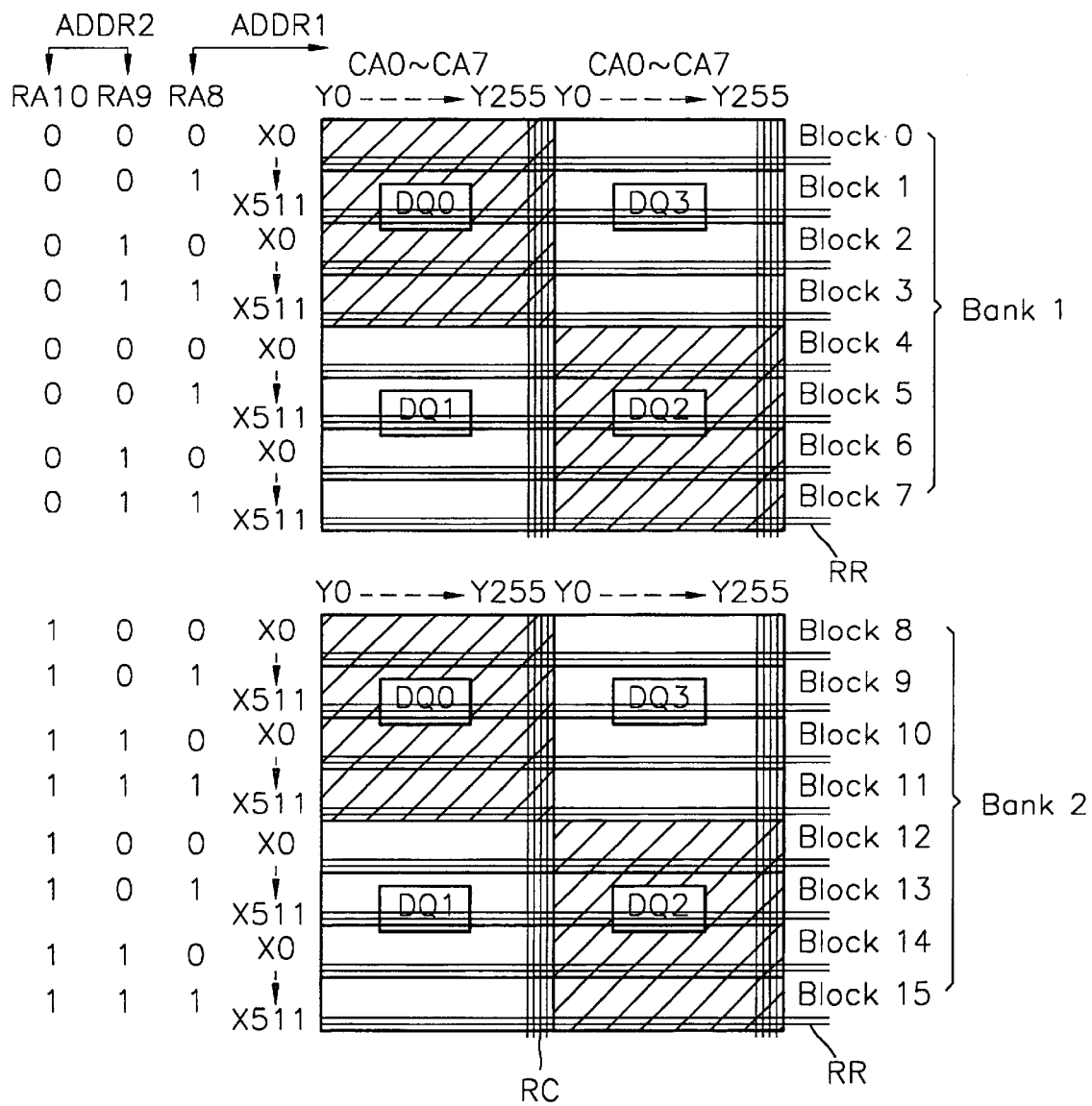
FIG. 3 is a schematic diagram showing the memory structure of a semiconductor memory device having a plurality of memory banks, for illustrating a method for testing the semiconductor memory device according to a first embodiment of the present invention.

FIG. 3 is a schematic diagram showing the memory structure of a semiconductor memory device having a plurality of memory banks, for illustrating a method for testing the semiconductor memory device according to a first embodiment of the present invention.

Referring to FIG. 3, the semiconductor memory device includes memory banks Bank1 and Bank2 each having 8 memory blocks, that is, Block0 through Block 7 and Block8 through Block15, respectively. The memory blocks Block0 through Block15 each include two memory cell arrays.

Each memory cell array includes physical first addresses ADDR1 which have nine bits (RA0~RA8), row addresses X0~X255 or X256~X511 and 8-bit (CA~CA7) column addresses Y0 through Y255, and memory cells (not shown) allocated to the physical first addresses ADDR1. Data is written to or read from each memory cell through only one of four representative data pins DQ0 through DQ3 during a test mode.

The memory blocks Block0 through Block15 each include two redundancy row lines RR and four redundancy column lines RC for repairing defects if one or more memory cells fail.

In this case, the ninth and tenth bits of the row addresses, i.e., RA9 and RA10, are virtual second addresses ADDR2, for determining whether there is a failing memory cell among the memory cells allocated to the first addresses ADDR1 in the memory blocks Block0 through Block15 during a memory test mode.

In other words, the bit RA10 of the second address ADDR2 is a bit for differentiating the first and second memory banks Bank1 and Bank2 from each other, and the bit RA9 is a bit for differentiating the memory blocks Block0 through Block7 from the memory blocks Block8 through Block15.

Figure 4:
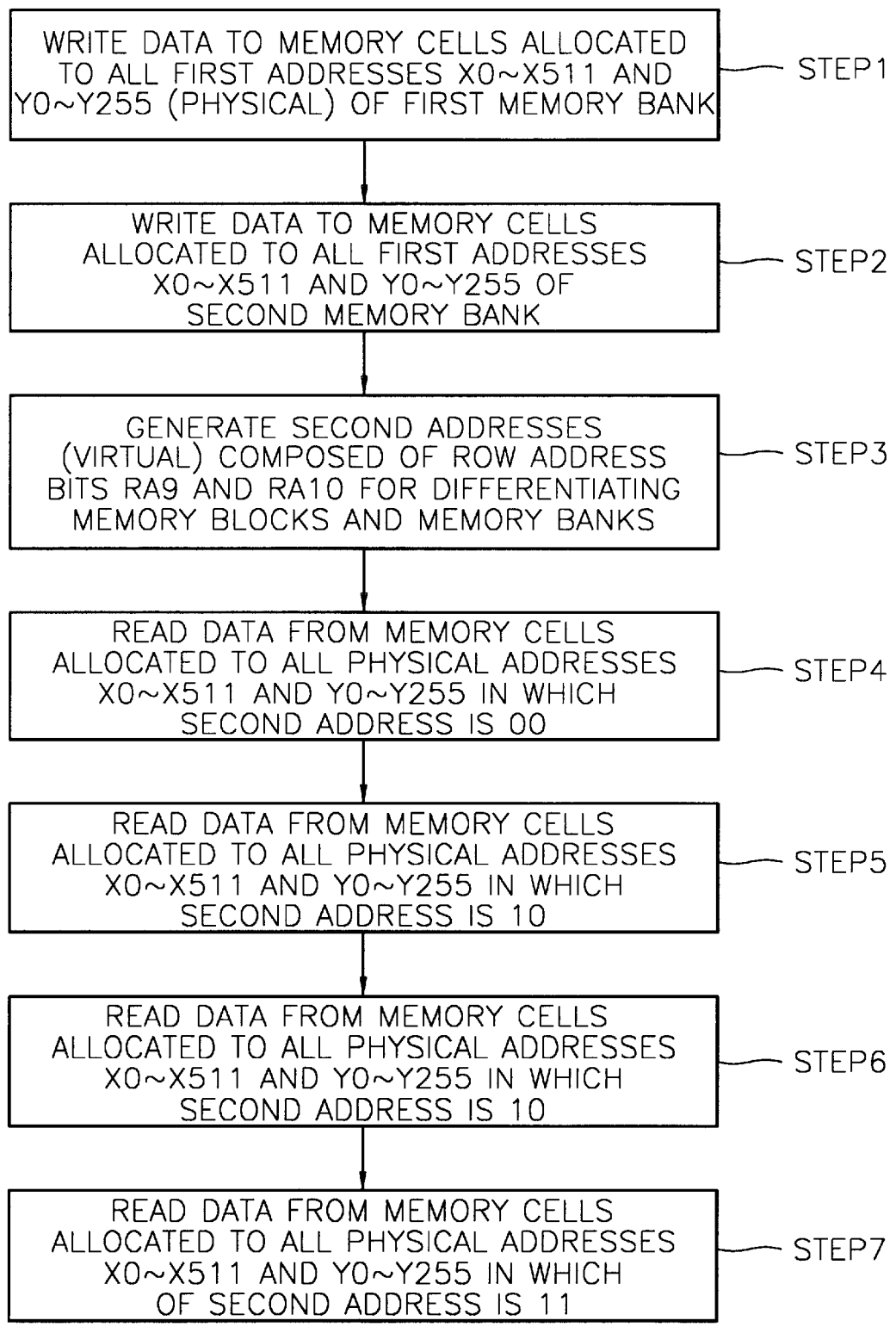
FIG. 4 is a flow chart illustrating the method for testing the semiconductor memory device shown in FIG. 3.

FIG. 4 is a flow chart illustrating the method for testing the semiconductor memory device shown in FIG. 3.

Referring to FIG. 4, in a first step, data of a logic low "0" or high "1" is written to memory cells allocated to all the first addresses X0 through X511 and Y0 through Y255 (physical) of the memory bank Bank1. In other words, data is written to the memory blocks Block0 through Block7.

In a second step, data of a logic low "0" or a logic high "1" is written to the memory cells allocated to all the first addresses ADDR1 of the memory bank Bank2, that is, X0 through X511 and Y0 through Y255. In other words, data is written to the memory blocks Block8 through Block15.

In a third step, second addresses ADDR2 (virtual) comprised of row address bits RA9 and RA10 for differentiating the memory blocks and the memory banks are generated. At this time, each second addresses has two bits, that is, 00 through 11.

In a fourth step, data is read from the memory cells allocated to all the first addresses X0 through X511 and Y0 through Y255 (physical) in which the second address is 00. As a result, the data is read from the memory blocks Block0, Block1, Block4 and Block5.

In a fifth step, data is read from the memory cells allocated to all the first addresses X512 through X1023 and Y0 through Y255 (physical) in which the second address is 01. As a result, the data is read from the memory blocks Block2, Block3, Block6 and Block7.

In a sixth step, data is read from the memory cells allocated to all the first addresses X1024 through X1537 and Y0 through Y255 (physical) in which the second address is 10. As a result, the data is read from the memory blocks Block8, Block9, Block12 and Block13.

In a seventh step, data is read from the memory cells allocated to all the first addresses X1538 through X2047 and Y0 through Y255 (physical) in which the second address is 11. As a result, the data is read from the memory blocks Block10, Block11, Block14 and Block15.

After the fourth through seventh steps, or in each step, the data read through each data pin is compared with the data written in the step 1 or 2, that any memory block, memory bank and physical address having a defective memory cell can be found. In other words, in the fourth through seventh steps, while bits of the second address are increased, the data stored in the respective memory blocks are read through the data pins DQ0 through DQ3 to test the memory cells of the memory blocks Block0 through Block15.

The fourth step will now be described in more detail.

First, if the eighth bit of the row address, i.e., RA8, is 0, the data of the memory block Block0 is output to the data pins DQ0 and DQ3 and the data of the memory block Block4 is output to the data pins DQ1 and DQ2. Thus, the data output to the data pins DQ0 through DQ3 is compared with the data written in the first step, thereby finding which physical address of either the memory block Block0 or Block4 includes a defective memory cell. Subsequently, if the eighth bit of the row address, RA8, is 1, the data of the memory block Block1 is output to the data pins DQ0 and DQ3 and the data of the memory block Block5 is output to the data pins DQ1 and DQ2. Thus, the data output to the data pins DQ0 through DQ3 is compared with the data written in the first step, thereby finding which physical address of either the memory block Block1 or Block5 includes a defective memory cell.

Next, the seventh step will now be described in more detail.

First, if the eighth bit of the row address, i.e., RA8, is 0, the data of the tenth memory block Block10 is output to the data pins DQ0 and DQ3 and the data of the fourteenth memory block Block14 is output to the data pins DQ1 and DQ2. Thus, the data output to the data pins DQ0 through DQ3 is compared with the data written in the second step, thereby finding which physical address of either the memory block Block10 or Block14 includes a defective memory cell. Subsequently, if the row address bit 8, i.e., RA8, is 1, the data of the memory block Block11 is output to the data pins DQ0 and DQ3 and the data of the memory block Block15 is output to the data pins DQ1 and DQ2. Thus, the data output to the data pins DQ0 through DQ3 is compared with the data written in the second step, thereby finding which physical address of either the memory block Block11 or Block15 includes a defective memory cell.

The fifth and sixth steps are performed in the same manner as the fourth and seventh steps, and their explanation will be omitted.

Figure 5:
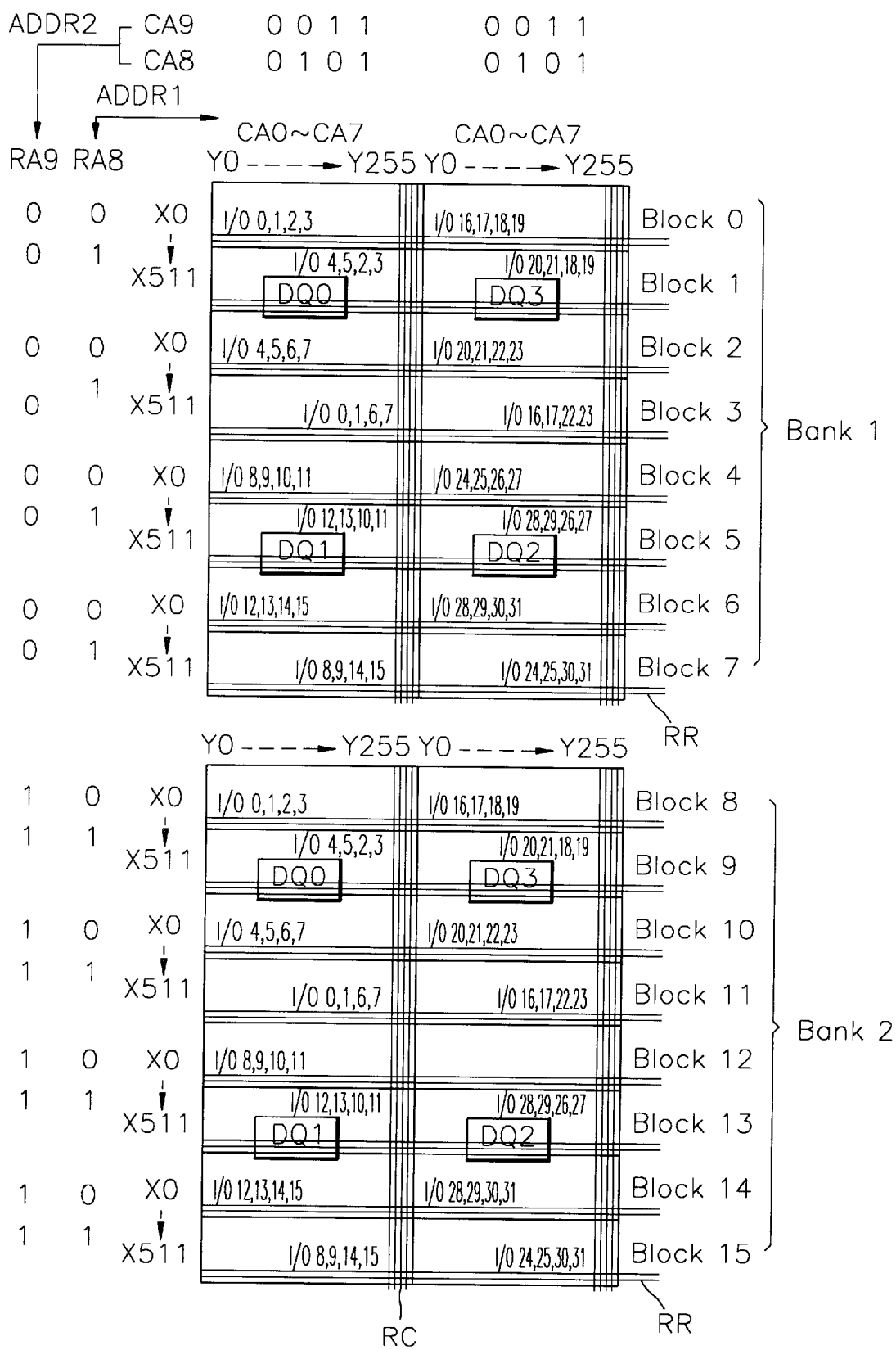
FIG. 5 is a schematic diagram showing the memory structure of a semiconductor memory device having a plurality of memory banks, for illustrating a method for testing the semiconductor memory device according to a second embodiment of the present invention.

FIG. 5 is a schematic diagram showing the memory structure of a semiconductor memory device having a plurality of memory banks, for illustrating a method for testing the semiconductor memory device according to a second embodiment of the present invention.

Referring to FIG. 5, the memory of the semiconductor memory device includes memory banks Bank1 and Bank2 each having 8 memory blocks, that is, memory blocks Block0 through Block 7 and memory blocks Block8 through Block15, respectively. The memory blocks Block0 through Block15 each include 2 memory cell arrays.

Each memory cell array includes first addresses ADDR1 (physical) having nine bits (RA0~RA8), row addresses X0~X255 or X256~X511 and 8-bit (CA0~CA7) column addresses Y0 through Y255, and memory cells (not shown) allocated to the physical first address ADDR1. Data is written to or read from each memory cell through only one of four representative data pins DQ0 through DQ3 during a test mode. Every four data input/output lines among the data input/output lines 100 through 1031 are allocated to memory cells, and the data is read from or written to the memory cells through the data input/output lines.

The memory blocks each include two redundancy row lines RR and four redundancy column lines RC for repairing any defective memory cells.

In this case, the ninth bit of the row address, i.e., RA9, and the eighth and ninth bits of the column address, i.e., CA8 and CA9, are second addresses ADDR2 (virtual). The bit RA9 is for differentiating the memory banks Bank1 and Bank2 from each other, and the bits CA8 and CA9 are for differentiating the groups of four data input/output lines allocated to the memory cells from one another.

Figure 6A:
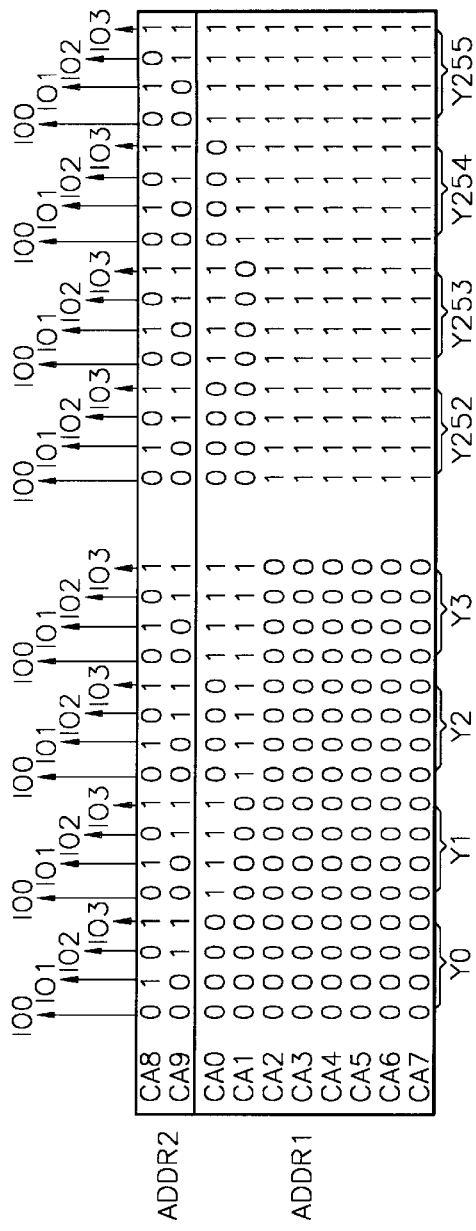
FIGS. 6A and 6B show the connection between memory cell arrays in which output data through a data pin 0 shown in FIG. 5 and data input/output lines 0 through 7.
Figure 6B:
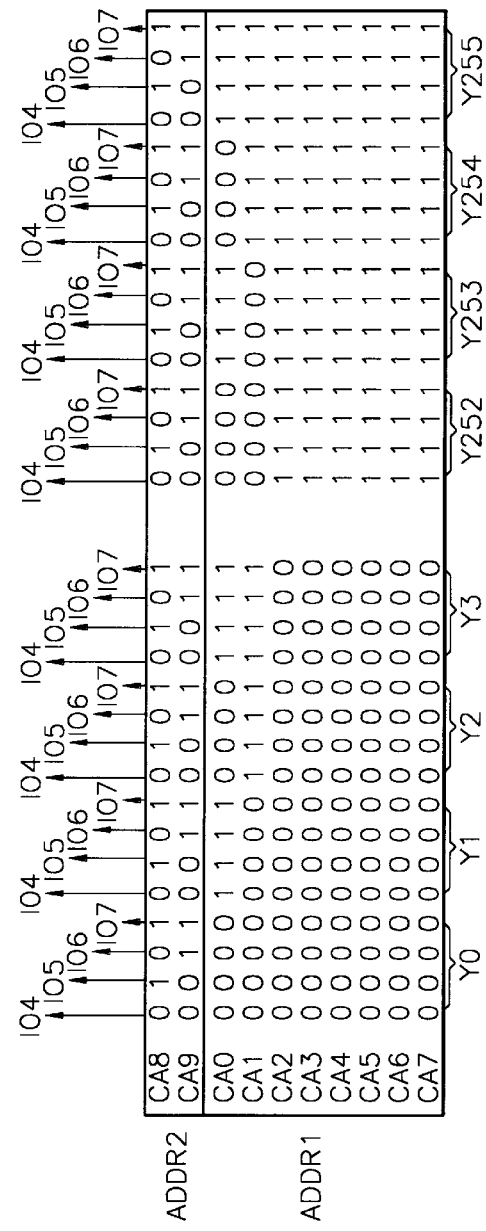

FIGS. 6A and 6B show the connection between memory cell arrays in which output data through the data pin DQ0 shown in FIG. 5 and the data input/output lines 100 through 107, in which FIG. 6A shows the first memory cell array of the memory blocks Block0 and Block8, and FIG. 6B shows the second memory cell array of the memory blocks Block1 and Block10.

Data is written to or read from the memory cells of the column addresses Y0 through Y255, through the data input/output lines 100 through 103, according to the eighth and ninth bits of the column address, i.e., CA8 and CA9, constituting the second addresses ADDR2. In other words, in the cases where the column address bits, i.e., CA8 and CA9, are 00, 01, 10 and 11, respectively, the data input/output lines 100, 101, 102 and 103 are selected in the memory cell array shown in FIG. 6A and the data input/output lines 104, 105, 106 and 107 are selected in the memory cell array shown in FIG. 6B.

Figure 7:
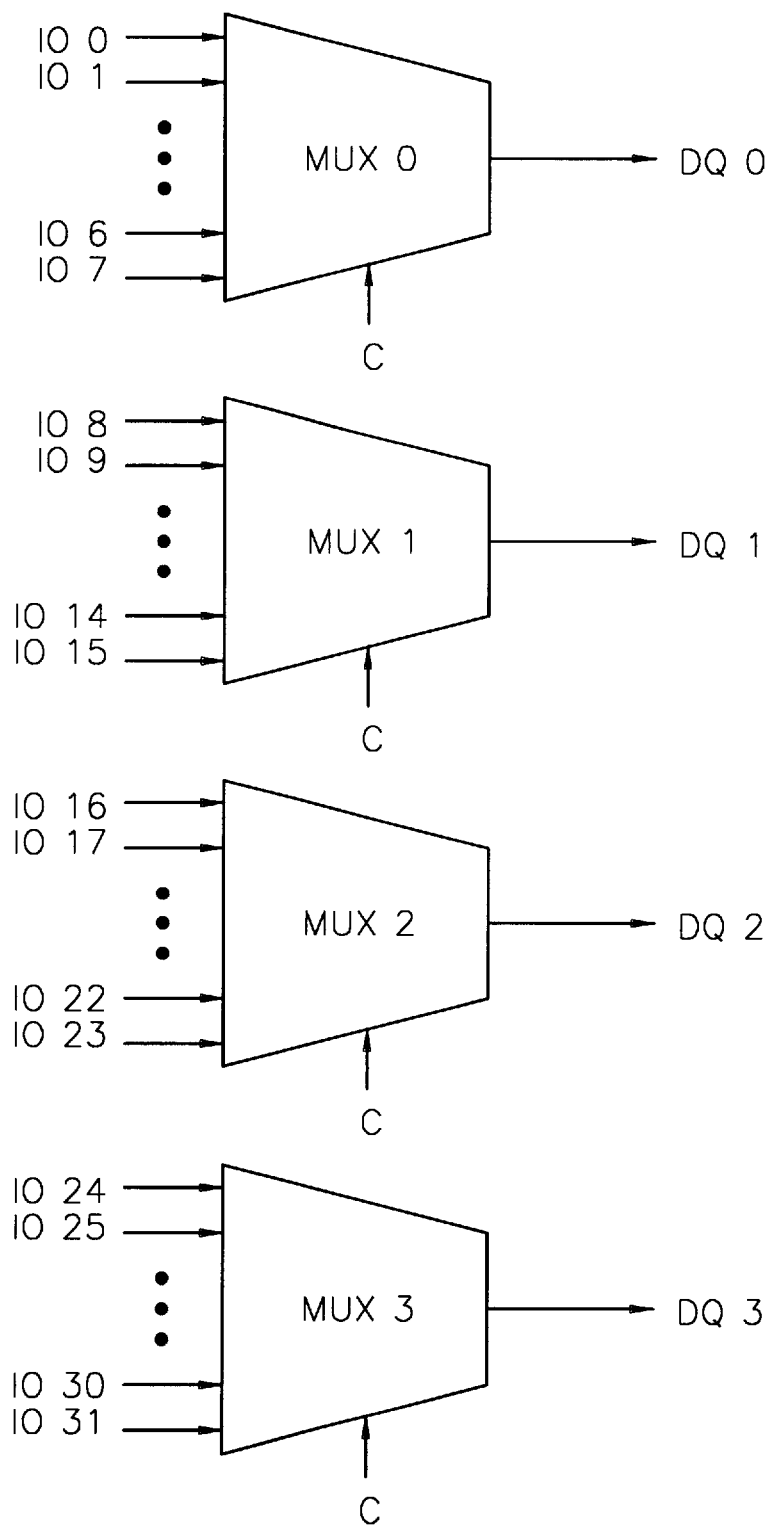
FIG. 7 shows multiplexers 0 through 3 connected to the data pins 0 through 3.

FIG. 7 shows multiplexers MUX0 through MUX3 connected to the data pins DQ0 through DQ3.

The multiplexers MUX0 through MUX3 each select one of 8 data input/output lines, that is, 100 through 107, 108 through 1015, 1016 through 1023 and 1024 through 1031, respectively, using a control signal C, and the data of the selected four data input/output lines are output to the data pins DQ0 through DQ3.

Figure 8:
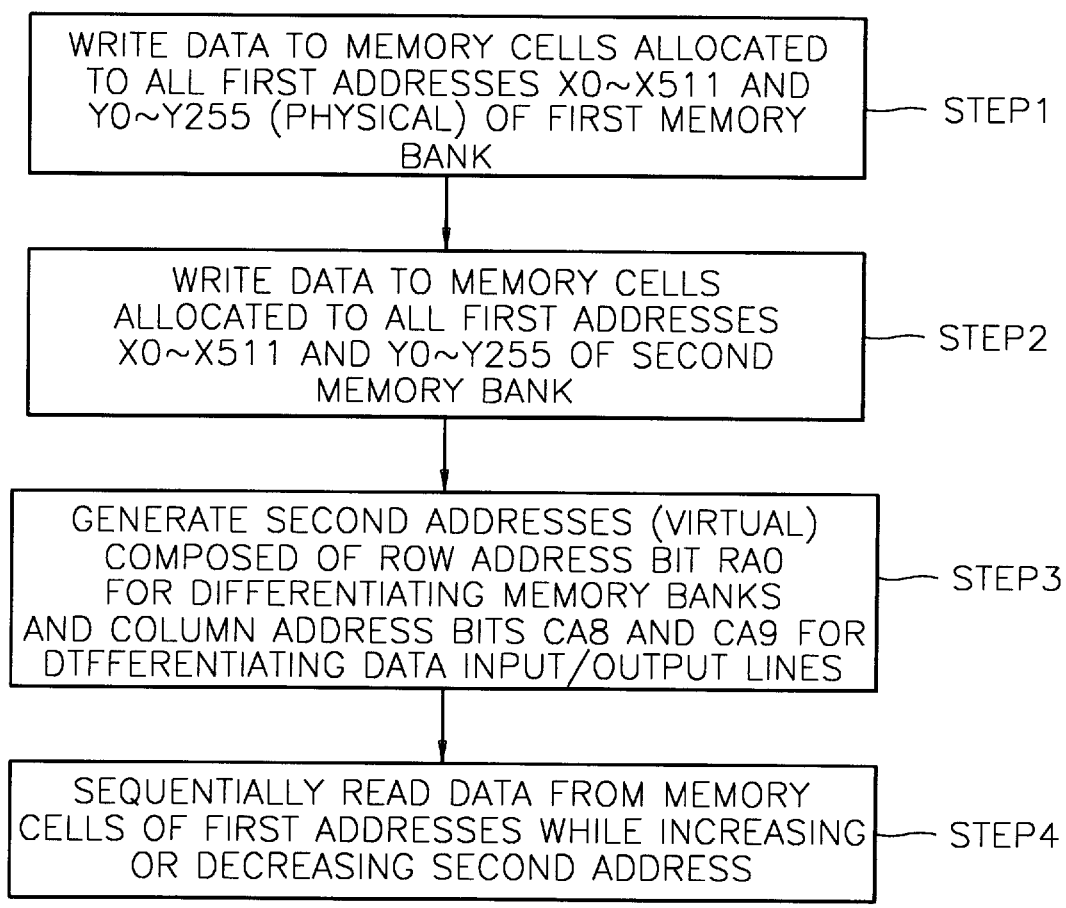
FIG. 8 is a flow chart illustrating the method for testing the semiconductor memory device shown in FIG. 5.

FIG. 8 is a flow chart illustrating the method for testing the semiconductor memory device shown in FIG. 5.

Referring to FIG. 8, as described in FIG. 4, in first and second steps, data is written to the memory cells allocated to all the first addresses X0 through X511 and Y0 through Y255 of the memory banks Bank1 and Bank2.

In a third step, second addresses (virtual) for differentiating between the memory banks and data input/output lines are generated.

At this time, since there are two memory banks, and $2^1=2$, only one row address bit, i.e., RA9, is used. Also, since there are four data input/output lines, and $2^2=4$, two column address bits, i.e., CA8 and CA9, are used.

In a fourth step, while the second addresses ADDR2 are increased or decreased, data is sequentially read from the memory cells of the first addresses ADDR1. If the read data does not match the data written in the first or second step, it is determined which memory cell is defective, and which memory bank, memory block and memory cell array include the defective memory cell, using the virtual addresses, the physical addresses and the numbers of the data pins through which the data are output.

In the fourth step, the case where the eighth bit of the first addresses ADDR1, i.e., RA8, is logic low "1" will be described.

If the bits of the second address ADDR2 are 000, the data input/output lines 100, 104, 108, 1012, 1016, 1020, 1024 and 1028 are selected. The selected data input/output lines are the first data input/output lines in the respective memory cells of the memory blocks Block0, Block2, Block4 and Block6 of the memory bank Bank1. Subsequently, if the control signals C for selecting the data input/output lines 100, 108, 1016 and 1024 are input to the multiplexers MUX 0 through MUX3 (see FIG. 7), the data stored in the memory cells of the first addresses ADDR1 of the first and second memory cells of the memory block Block0 is output through the data pins DQ0 and DQ3, and the data stored in the memory cells of the first addresses ADDR1 of the first and second memory cells of the memory block Block4 is output through to the data pins DQ1 and DQ4.

The data output through the data pins DQ0 through DQ3 is compared with the data written in the first or second step, thereby finding which memory cell is defective, and memory cell array include the defective memory cell.

The case described above was where the bit RA8 of the first address ADDR1 was logic low "0" and the bits of the second address ADDR2 were 000. However, the cases where the bit RA8 is logic high "1" and the bits of the second address ADDR2 are 001 or 111 can be inferred from the above description, and thus their explanation will be omitted.

Figure 9:
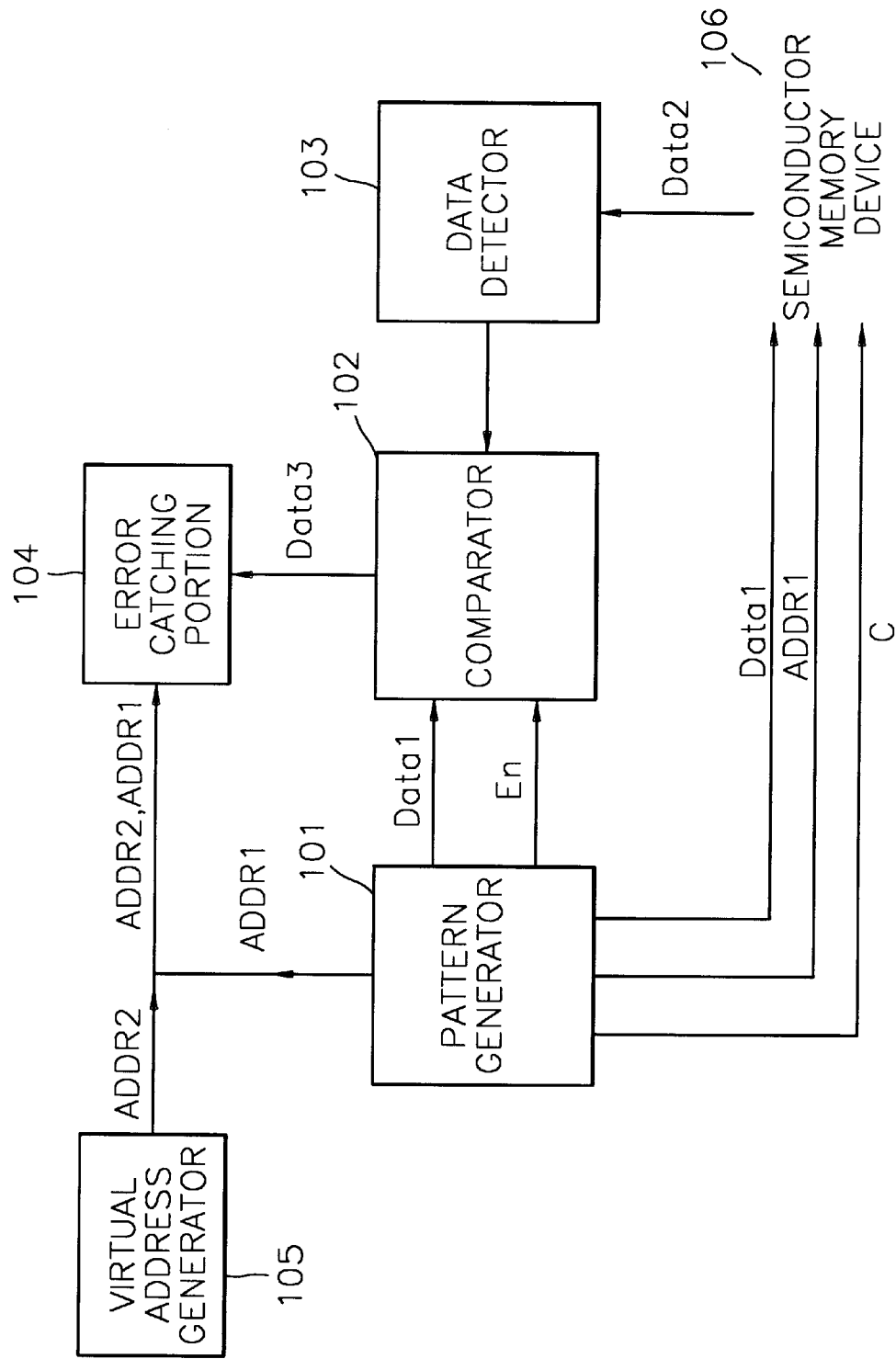
FIG. 9 is a schematic diagram illustrating a semiconductor memory testing apparatus according to the present invention.

FIG. 9 is a schematic diagram illustrating a semiconductor memory testing apparatus according to the present invention.

Referring to FIG. 9, a semiconductor memory testing apparatus 100 includes a pattern generator 101, a comparator 102, a data detector 103, an error catching portion 104 and a virtual address generator 105.

The pattern generator 101, e.g., an algorithmic pattern generator (ALPG), generates a pattern composed of first addresses ADDR1 which are physical addresses, having row addresses and column addresses, allocated to the memory cells, and first data Data1 for being written to the memory cells allocated to the first addresses ADDR1.

The virtual address generator 105 generates second addresses ADDR2 which are virtual addresses for determining which memory cell array includes the first addresses ADDR1.

In other words, the second addresses ADDR2 are for differentiating memory banks and memory blocks of a semiconductor memory device 106, and are composed of two bits not included in the first (physical) addresses ADDR1 among row addresses, i.e., the ninth and tenth bits, RA9 and RA10.

In addition, the second addresses ADDR2 may be composed of one bit for differentiating memory banks, i.e., the ninth bit RA9, not included in the first (physical) addresses ADDR1 among row addresses, and two bits for differentiating four data input/output lines allocated to the respective memory cells, not included in the first (physical) addresses ADDR1 among column addresses, i.e., the eighth and ninth bits, CA8 and CA9.

The data detector 103 detects the voltage level of the second data Data2 output from the data input/output pins of the semiconductor memory device 106. The comparator 102, enabled by an enable signal En output from the pattern generator 101, compares the data detected by the data detector 103 and the first data Data1, and outputs the numbers of the data input/output pins as the third data Data3 if the compared data units are different from each other, that is, if a cell fails the test.

The error catching portion 104, e.g., an error catch RAM, stores the first addresses ADDR1, the second addresses ADDR2 and the third data Data3, and will be described in detail later, with reference to FIG. 10.

The operation of testing the semiconductor memory device 106 will now be briefly described using the semiconductor testing apparatus 100.

First, the pattern generator 101 outputs the control signal C and the pattern, to the semiconductor memory device 106, to initiate the semiconductor memory device 106, thereby writing data to all memory cells of the semiconductor memory device 106. Then, the data stored in the memory cells of the first addresses ADDR1 is sequentially read out according to the second addresses ADDR2, through the data input/output pins, to then be compared to the previously written data.

The data stored in the error catching portion 104, that is, the numbers of data input/output pins from which defect data is output, and the first and second addresses ADDR1 and ADDR2 corresponding to the data input/output pin numbers, are analyzed, thereby finding which memory cell is defective, and which memory bank, memory block and memory cell array include the defective memory cell.

The second addresses ADDR2 may include virtual address bits for differentiating data input/output lines through which the data stored in the memory cells of the first addresses ADDR1 are output, as well as virtual address bits for differentiating the memory blocks and the memory banks of the semiconductor memory device 106. The control signal C of the pattern generator 101 controls the semiconductor memory device 106 so that the data is read sequentially according to the numbers of the data input/output lines, when the semiconductor testing apparatus 100 writes the data to the semiconductor memory device 106 and reads out the data from the semiconductor memory device 106.

Figure 10:
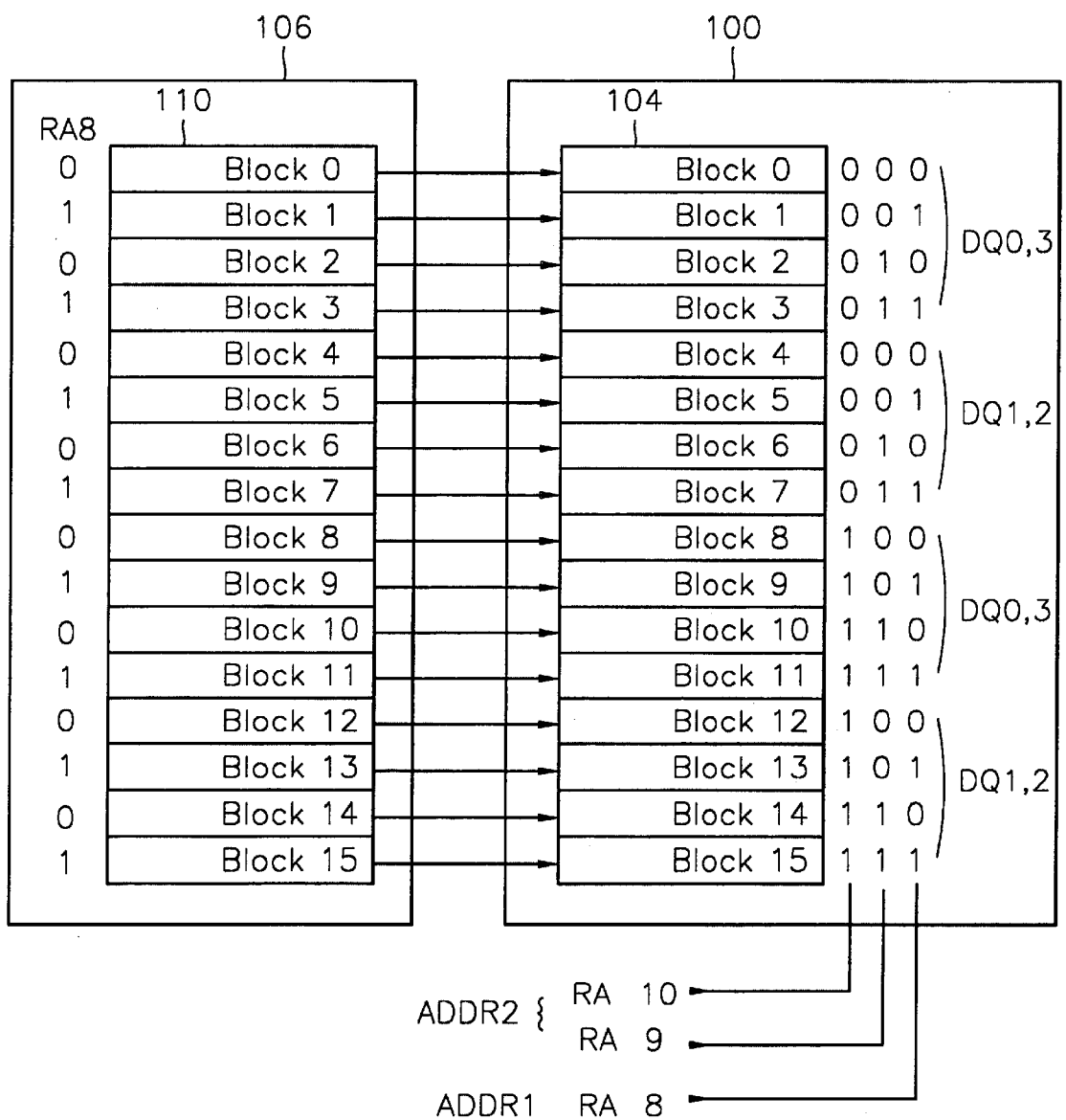
FIG. 10 is a schematic diagram of an error catching portion shown in FIG. 9.

FIG. 10 is a schematic diagram of the error catching portion 104 shown in FIG. 9.

Referring to FIGS. 3 and 10, the error catching portion 104 is divided into 16 addresses, in each of which first and second addresses ADDR1 and ADDR2 indicative of the locations of defective memory cells of the semiconductor memory device 106, and the numbers of the data input/output pins through which the data are output from the memory cells allocated to the first and second addresses ADDR1 and ADDR2.

The first addresses ADDR1 are physical addresses having the eighth row address bit, i.e., RA8, and the second addresses ADDR2 are virtual addresses having the ninth and tenth bits, i.e., RA9 and RA10.

The memory block Block0 of which the eighth bit, i.e., RA8, logic low, and the second address ADDR2 is 00, are output through the data input/output pins DQ0 and DQ3, is located in the first address of the error catching portion 104, and the physical address of a defective memory cell is stored therein. The memory block Block15 of which the eighth row address bit, i.e., RA8, is logic high and the second address ADDR2 is 11, output through the data input/output pins DQ1 and DQ2, is located in the 16th address of the error catching portion 104, and the physical address of the memory block Block15 is stored therein.

In other words, the defect information of the memory blocks of the semiconductor memory device 106 is stored in the respective addresses of the error catching portion 104, at a ratio of 1 to 1. Therefore, the information stored in the error catching portion 104 is analyzed, to find which defective memory cell corresponds to which memory cell array of one of the memory blocks Block1 through Block15 of the semiconductor memory device 106. As a result, the defective memory cell can be repaired by a row redundant line or a column redundant line.

The case where the second addresses ADDR2 are composed of the ninth and tenth bits, i.e., RA9 and RA10, has been described above. However, the second addresses ADDR2 may also be composed of bits RA9, CA8 and CA9, for differentiating memory banks and data input/output lines. In this case, since it is possible to know which data input/output line number the defective memory cell belongs to, among the memory cells allocated to the first addresses ADDR1, a defective bit map can be implemented according to the first addresses ADDR1 of the memory cell arrays and data input/output lines.

Therefore, in the semiconductor memory device having a plurality of memory banks according to the present invention, virtual addresses for differentiating between the memory cell arrays are generated and data is sequentially read from the memory cells of the physical addresses according to the virtual addresses, thereby finding the memory cell array to which the defective memory cell belongs.

Having thus described at least one illustrative embodiment of the invention, the foregoing description is by way of example only and is not intended to be limiting. Various alterations and equivalents will readily occur to those skilled in the art. Such alterations and modifications are within the spirit and scope of the invention.

What is claimed is:

1. A memory testing method of a semiconductor memory device having a plurality of memory banks, each memory bank having a plurality of memory blocks, each memory block having a plurality of memory cell arrays, each memory cell array having a plurality of memory cells, each memory cell allocated to physical addresses composed of row addresses and column addresses, the method comprising the steps of:

(1) selecting one of the memory banks and writing data to all the memory cells formed in the selected memory bank which are allocated to first addresses which are physical;
    (2) sequentially selecting the memory banks one by one and performing the step (1);
    (3) generating virtual second addresses, for differentiating the memory cells of the first addresses; and
    (4) sequentially reading out data from the memory cells of the first addresses while changing the bits of the first and second addresses, to the outside of the semiconductor memory device through data pins, and determining a memory cell array to which a defective memory cell belongs, using the first and second addresses and the numbers of the data pins through which the data are output, if the read data is not the same as the data written in the step (1) or (2).

2. The method according to claim 1, wherein the second addresses are for differentiating the memory banks and the memory blocks.

3. The method according to claim 2, wherein the second addresses are composed of n bits (n=0, 1, 2, . . . ) not included in the first addresses of row addresses, where n is determined by the numbers of memory banks and memory blocks.

4. The method according to claim 1, wherein the second addresses are for differentiating the memory banks and data input/output lines allocated to each memory cell array.

5. The method according to claim 4, wherein the second addresses are composed of n bits (n=0, 1, 2, . . . ) not included in the first addresses among row addresses, and m bits (m=0, 1, 2, . . . ) not included in the first addresses among column addresses, where n is determined by the number of memory banks and m is determined by the number of data input/output lines allocated to each memory cell array.

6. The method according to claim 1, wherein when the second addresses are for differentiating the memory banks and the data input/output lines allocated to memory cell array, in the step (4), a defective bit map according to the data input/output lines is implemented with all the memory cells of the first addresses.

7. The method according to claim 1, wherein the semiconductor memory device is a synchronous DRAM.

8. The method according to claim 1, wherein the semiconductor memory device is a memory merged with a logic circuit (MML).

9. An apparatus for testing a semiconductor memory device having a plurality of memory banks, each memory bank having a plurality of memory blocks, each memory block having a plurality of memory cell arrays, each memory cell array having a plurality of memory cells, each memory cell allocated to physical addresses composed of row addresses and column addresses, the apparatus comprising:

a pattern generator for generating a pattern composed of first addresses which are physical addresses, having row addresses and column addresses, to which the memory cells are allocated, and first data for being written to the memory cells allocated to the first addresses;
    a virtual address generator for generating second addresses which are virtual addresses, for differentiating the memory cells of the first addresses;
    a data detector for detecting second data output through data input/output pins of the semiconductor memory device;
    a comparator for comparing the second data detected by the data detector with the first data, and outputting the numbers of the data input/output pins as third data; and
    an error catching portion for storing the first addresses, the second addresses and the third data, wherein the first addresses, the second addresses and the third data are analyzed to determine which memory cells are defective, and to which memory bank, memory block and memory cell array each defective memory cell belongs.

10. The apparatus according to claim 9, wherein the error catching portion is an error catch memory in which defect information for the respective memory blocks of the semiconductor memory device is stored at a ratio of 1 to 1.

11. The apparatus according to claim 9, wherein the second addresses are for differentiating the memory banks and the memory blocks.

12. The apparatus according to claim 11, wherein the second addresses are composed of n bits (n=0, 1, 2, . . . ) not included in the first addresses of row addresses, where n is determined by the numbers of memory banks and memory blocks.

13. The apparatus according to claim 9, wherein the second addresses are addresses for differentiating the memory banks and the data input/output lines allocated to each memory cell array.

14. The apparatus according to claim 13, wherein the second addresses are composed of n bits (n=0, 1, 2, . . . ) not included in the first addresses among row addresses, and m bits (m=0, 1, 2, . . . ) not included in the first addresses among column addresses, where n is determined by the number of memory banks and m is determined by the number of data input/output lines allocated to each memory cell array.

15. The apparatus according to claim 9, wherein when the second addresses are stored in the error catching portion, a defective bit map according to the data input/output lines is implemented with all the memory cells of the first addresses by the error catching portion.

* * * * *